US006992399B2

(12) United States Patent
Stewart

(10) Patent No.: US 6,992,399 B2
(45) Date of Patent: Jan. 31, 2006

(54) DIE CONNECTED WITH INTEGRATED CIRCUIT COMPONENT FOR ELECTRICAL SIGNAL PASSING THEREBETWEEN

(75) Inventor: Robert E. Stewart, Woodland Hills, CA (US)

(73) Assignee: Northrop Grumman Corporation, Woodland Hills, CA (US)

( * ) Notice: Subject to any disclaimer, the term of this patent is extended or adjusted under 35 U.S.C. 154(b) by 282 days.

(21) Appl. No.: 10/159,777

(22) Filed: May 31, 2002

(65) Prior Publication Data

US 2003/0222337 A1 Dec. 4, 2003

Related U.S. Application Data

(63) Continuation-in-part of application No. 10/154,683, filed on May 24, 2002.

(51) Int. Cl.
*H01L 23/48* (2006.01)

(52) U.S. Cl. .................................................... 257/779

(58) Field of Classification Search ................ 257/686, 257/737, 777–779; 438/117
See application file for complete search history.

(56) References Cited

U.S. PATENT DOCUMENTS

| | | | | | |
|---|---|---|---|---|---|
| 5,152,695 | A | * | 10/1992 | Grabbe et al. | 439/71 |
| 5,172,050 | A | * | 12/1992 | Swapp | 324/762 |
| 5,465,611 | A | * | 11/1995 | Ruf et al. | 73/104 |
| 5,475,318 | A | * | 12/1995 | Marcus et al. | 324/762 |
| 5,723,894 | A | * | 3/1998 | Ueno et al. | 257/415 |
| 6,052,287 | A | * | 4/2000 | Palmer et al. | 361/767 |
| 6,072,700 | A | * | 6/2000 | Nam | 361/783 |
| 6,105,427 | A | | 8/2000 | Stewart et al. | |
| 6,441,315 | B1 | * | 8/2002 | Eldridge et al. | 174/260 |
| 6,465,747 | B2 | * | 10/2002 | DiStefano et al. | 174/261 |
| 6,520,778 | B1 | * | 2/2003 | Eldridge et al. | 439/66 |
| 6,565,392 | B2 | | 5/2003 | Padro | |
| 6,651,325 | B2 | * | 11/2003 | Lee et al. | 29/846 |
| 6,791,176 | B2 | * | 9/2004 | Mathieu et al. | 257/690 |
| 2002/0055282 | A1 | * | 5/2002 | Eldridge et al. | 439/66 |

OTHER PUBLICATIONS

"MEMS"; http://www.techweb.com/encyclopedia/defineterm?term=MEMS&x=23&y=12; TechEncyclopedia; Computer Language Company, 5521 State Park Road, Point Pleasant, PA 18950; 1 pg.; May 20, 2002.
"die"; http://www.techweb.com/encyclopedia/defineterm?term=die; TechEncyclopedia; Computer Language Company, 5521 State Park Road, Point Pleasant, PA 18950; 1 pg.; May 24, 2002.
"Compliant"; http://www.dictionary.com/search?q=compliant; Lexico, LLC; Lexico, LLC, 13428 Maxella Avenue #236, Marina del Rey, CA 90292; 2 pgs.; May 24, 2002.
"Stress"; http://www.dictionary.com/search?q=stress; Lexico, LLC; Lexico, LLC, 13428 Maxella Avenue #236, Marina del Rey, CA 90292; 6 pgs.; May 24, 2002.
"flip chip technology"; http://www.seminiconductorglossary.com/default.asp?searchterm=flip+chip+technology; 1 pg.; May 20, 2002.
"Backplane"; http://www.maximon.com/eb.htm; LLH Technology Publishing, Eagle Rock, VA USA; 1 pg.; May 20, 2002.

* cited by examiner

*Primary Examiner*—David A. Zarneke
(74) *Attorney, Agent, or Firm*—Patti & Brill, LLC

(57) ABSTRACT

An apparatus in one example includes a die with at least first and second portions, the first portion of the die mechanically and electrically connectable with a circuit board. The apparatus includes an integrated circuit component mechanically and electrically connected with the second portion of the die. Upon operation the die serves to generate one or more electrical signals that are passed to the integrated circuit component.

26 Claims, 9 Drawing Sheets

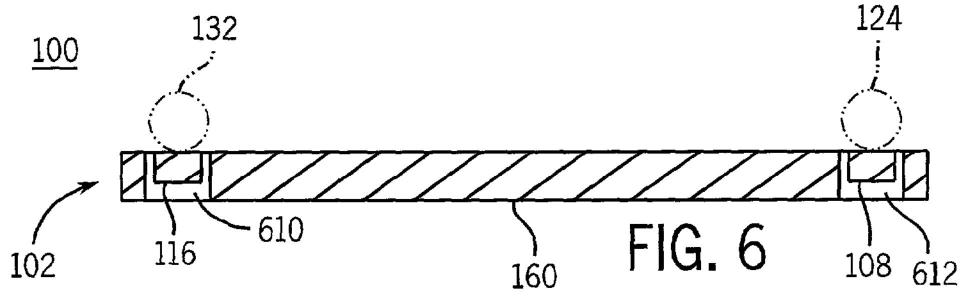
FIG. 6
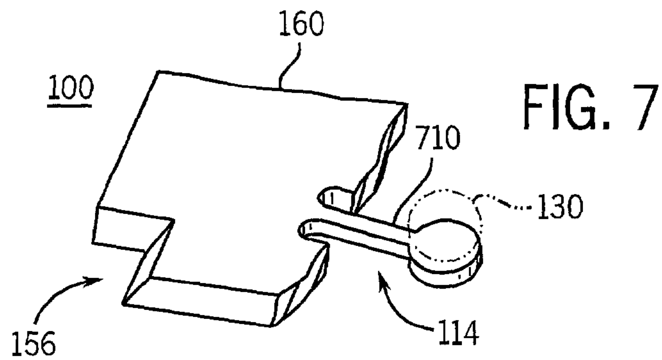
FIG. 7
FIG. 8
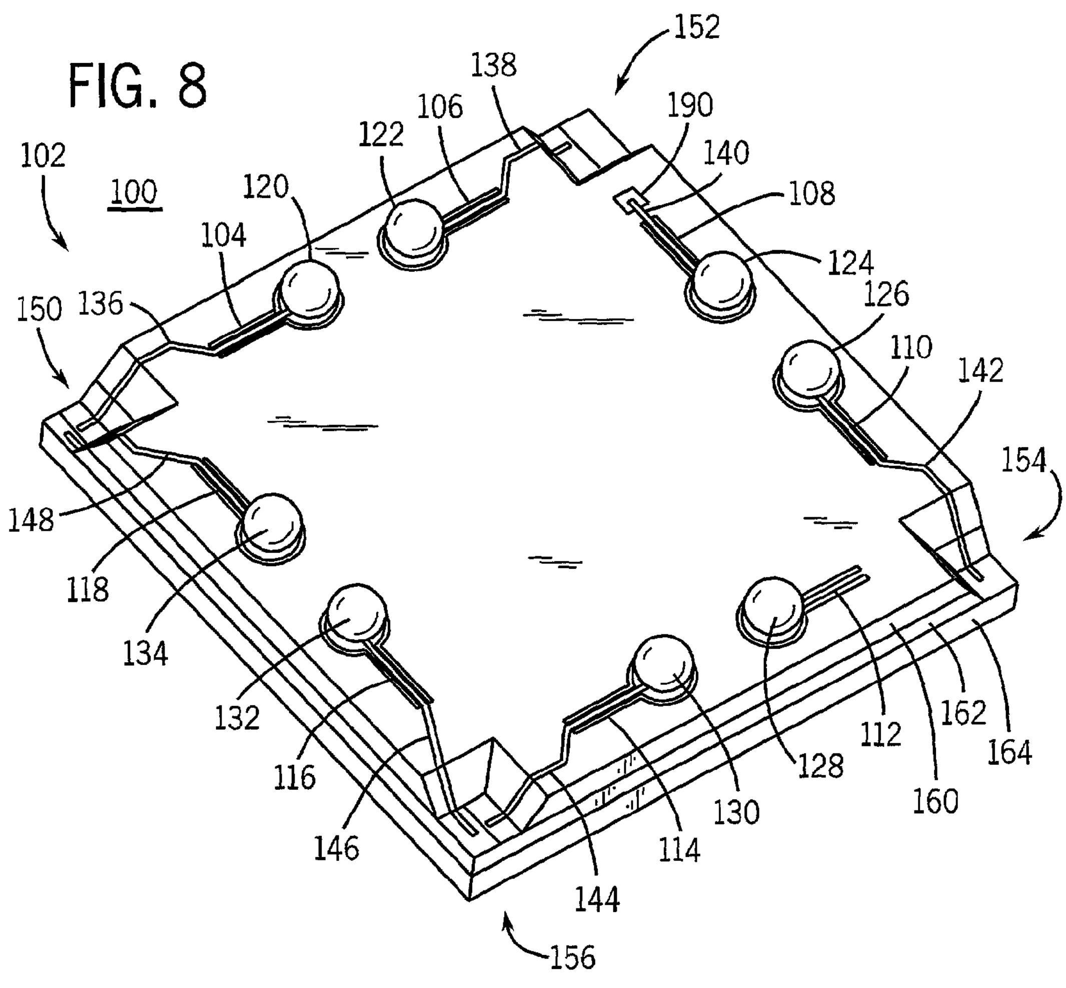

DIE CONNECTED WITH INTEGRATED CIRCUIT COMPONENT FOR ELECTRICAL SIGNAL PASSING THEREBETWEEN

CROSS-REFERENCE TO RELATED APPLICATION

This application is a continuation-in-part of commonly-owned U.S. patent application Ser. No. 10/154,683 (by Robert E. Stewart, filed May 24, 2002, and entitled "COMPLIANT COMPONENT FOR SUPPORTING ELECTRICAL INTERFACE COMPONENT"), which is hereby incorporated herein by reference in its entirety.

TECHNICAL FIELD

The invention in one example relates generally to electromechanical systems and more particularly to connection between parts in an electromechanical system.

BACKGROUND

A three dimensional die with multiple layers, as one example of an electrical circuit, requires electrical connections to multiple layers. For example, wire bonds serve to provide the electrical connections between the layers. In some cases, the wire bonds must be made to contacts on both the top and bottom of the die. Having wire bond contacts on both the top and bottom of the die can result in the need to fabricate subassemblies with wire bonds wrapping around multiple sides of the die. Having wire bonds that wrap around multiple sides of a die make the die difficult to package. Having wire bonds wrap around the die increases the periphery of the die. Having a larger periphery increases the space used by the die when the die is mounted to a substrate, circuit board, or the like. In addition, wire bonds are very thin and therefore susceptible to stress damage.

In another example, the die is packaged in a housing with electrical feed throughs. Wire bond contacts are made to electrical contacts on different layers of the die. These bond wires are then attached to feed throughs in the housing. The feed throughs in the housing allow for an interface with a substrate, circuit board, or the like. Creating the wire bonds and electrical feed through is complicated to assemble, expensive, and fragile.

In another example, the die has one or more layers. The die makes an electrical connection to a substrate, circuit board, or the like, of a different material than the die. Since the materials are different, they are likely to have different expansion/contraction coefficients. When expansion occurs in one or both of the materials, a stress is placed on the connection between the two materials. When the stress is large enough the connection can fail or break.

In another example, the die makes an electrical connection to a substrate, circuit board, or the like. When translational or rotational movement occurs a stress is placed on the connection between the die and the substrate, circuit board, or the like.

In another example, processing electronics are used in combination with the die. Both of the processing electronics and the die must make an electrical connection to a substrate, circuit board, or the like. Two separate connection spaces must be used on the substrate, circuit board, or the like.

In another example, the processing electronics and the die must go through testing together. To test the processing electronics and the die together they must be installed to a substrate, circuit board, or the like.

Thus, a need exists for a die that has increased durability in the interface between the die and a compatible structure. A need also exists for a die with decreased size. A need also exists for a die that is easier to electrically interface with compatible structures. A need also exists for a die and processing electronics to use a same connection space. A need also exists for a die and processing electronics to be tested before installation to a substrate, circuit board, or the like.

SUMMARY

The invention in one embodiment encompasses an apparatus. The apparatus includes a die with at least first and second portions, the first portion of the die mechanically and electrically connectable with a circuit board. The apparatus includes an integrated circuit component mechanically and electrically connected with the second portion of the die. Upon operation the die serves to generate one or more electrical signals that are passed to the integrated circuit component.

DESCRIPTION OF THE DRAWINGS

Features of exemplary implementations of the invention will become apparent from the description, the claims, and the accompanying drawing in which:

FIG. 6 is a sectional representation of the die directed along line 6—6 of FIG. 1.

FIG. 7 is one example of a compliant component of the apparatus of FIG. 1.

FIG. 8 is another example of the die of the apparatus of FIG. 1.

DETAILED DESCRIPTION

Figure 1:
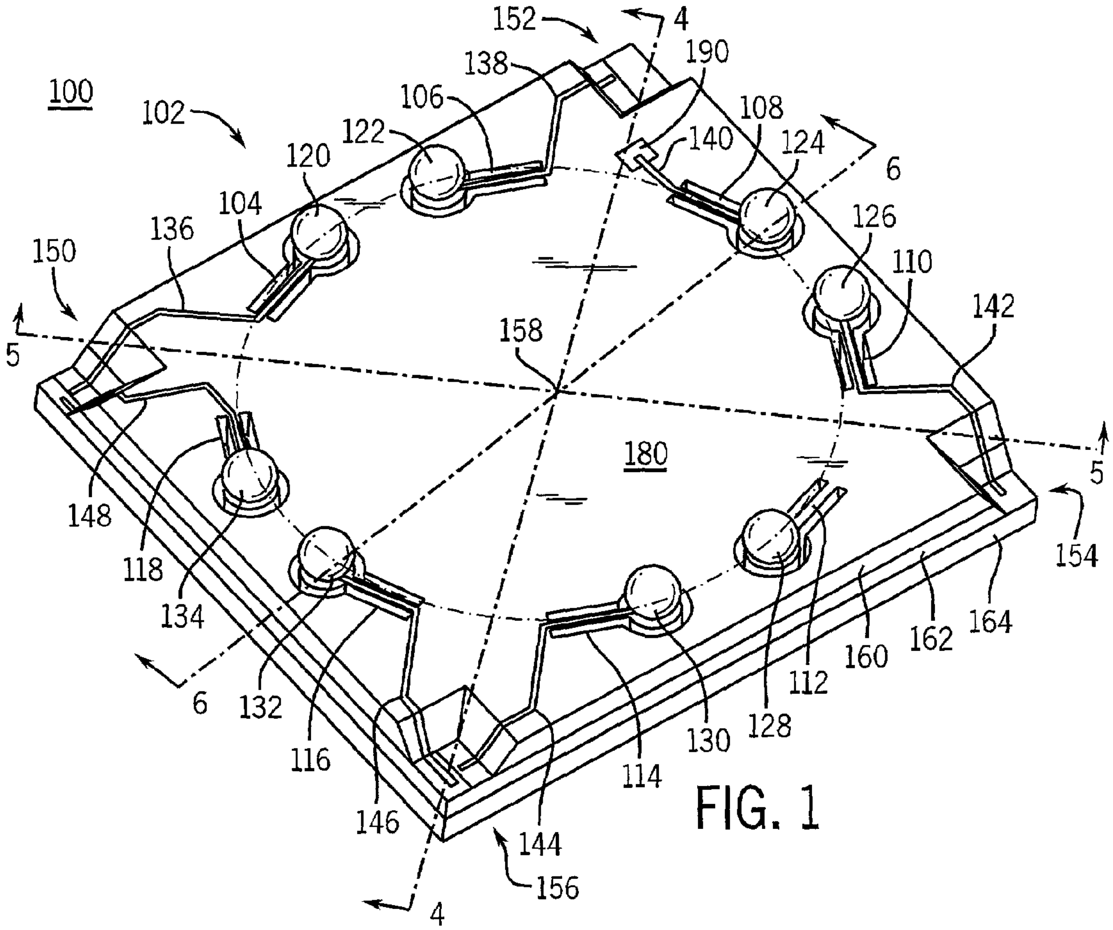
FIG. 1 is one example of an apparatus that includes a die that comprises one or more layers, one or more connection paths, one or more electrical contact locations, one or more electrical interface components, and one or more compliant components.
Figure 3:
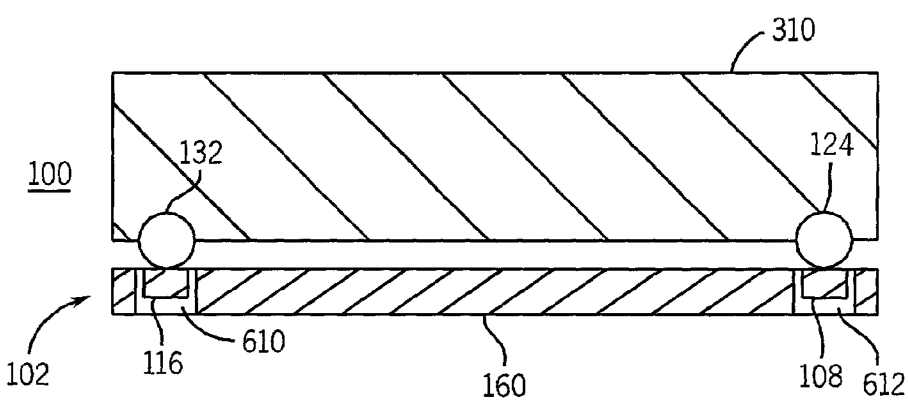
FIG. 3 is one example of an electrical connection between the die and a separate layer of the apparatus of FIG. 1.
Figure 2:
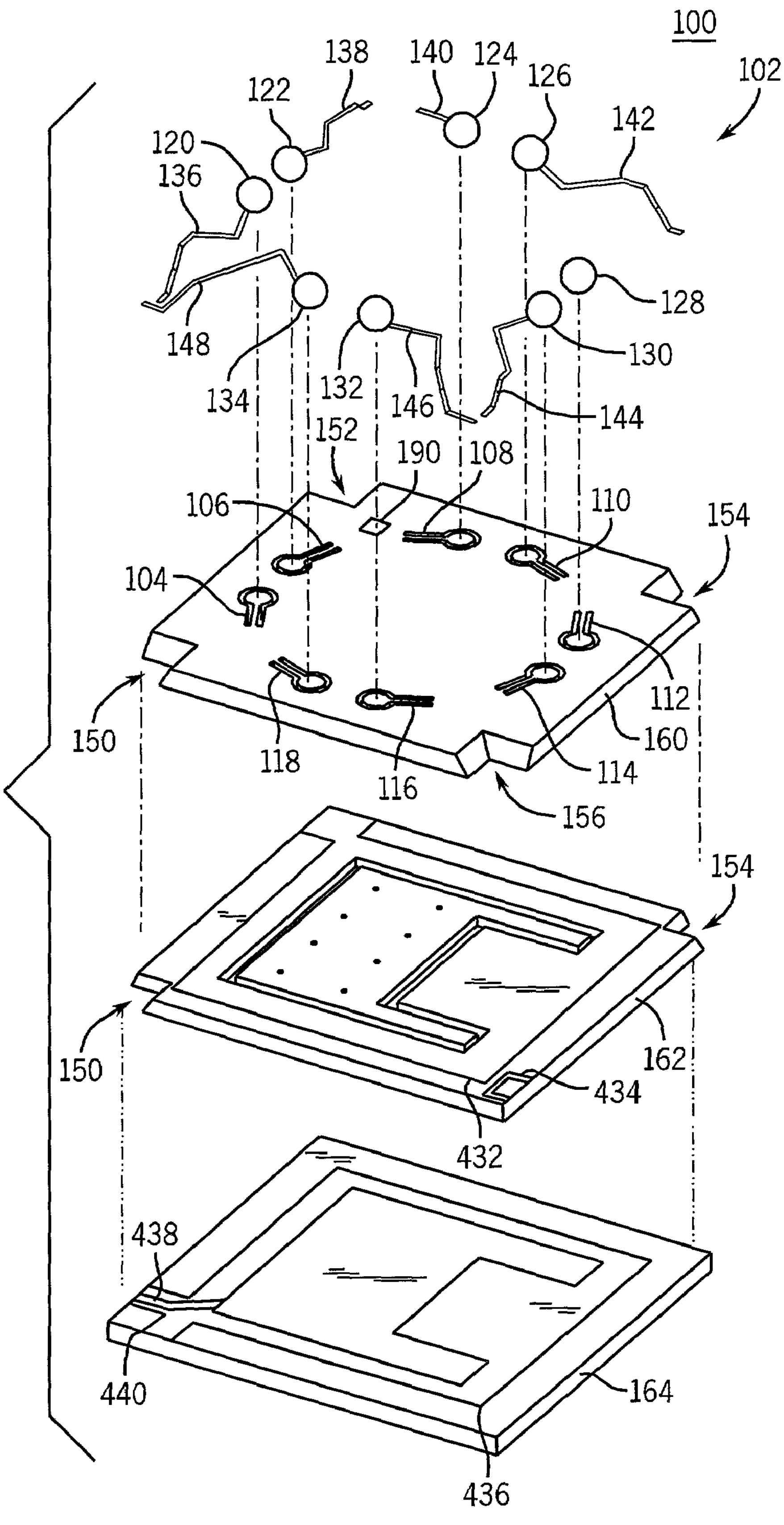
FIG. 2 is one exploded representation of the die of the apparatus of FIG. 1.

Turning to FIGS. 1–3, an apparatus 100 in one example comprises one or more dice 102 and one or more separate layers 310. The die 102 comprises, for example, a micro-electro-mechanical system ("MEMS"), sensor, actuator, accelerometer, switch, stress sensitive integrated circuit, or the like. The die 102 includes one or more layers 160, 162, and 164, one or more compliant components 104, 106, 108, 110, 112, 114, 116, and 118, one or more electrical interface components 120, 122, 124, 126, 128, 130, 132, and 134, and one or more connection paths 136, 138, 140, 142, 144, 146, and 148. The separate layer 310 in one example comprises a substrate, circuit board, electronic device, die, or the like.

Figure 4:
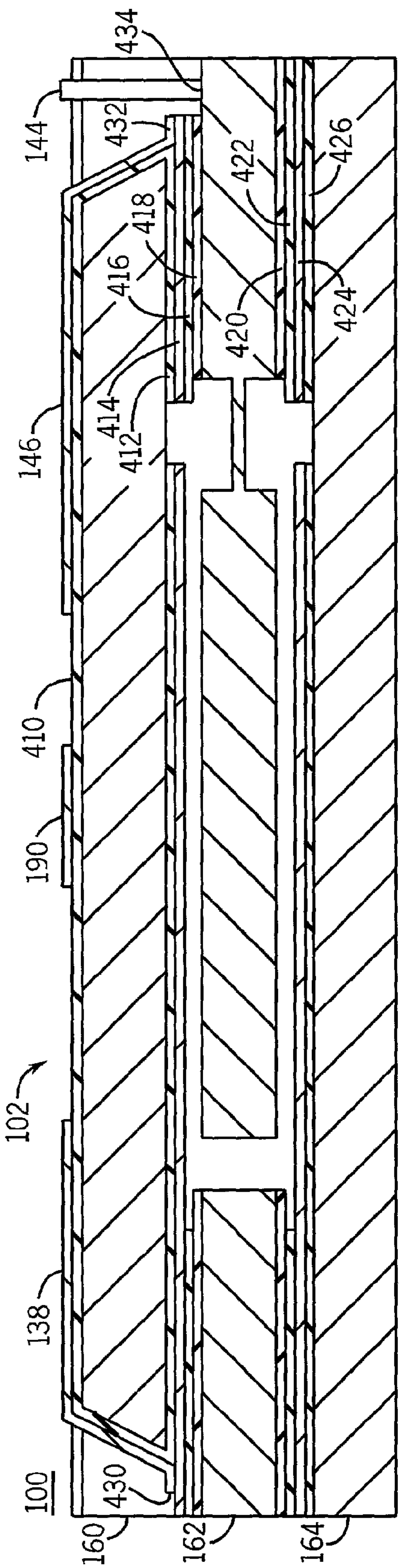
FIG. 4 is a sectional representation of the die directed along line 4—4 of FIG. 1.
Figure 5:
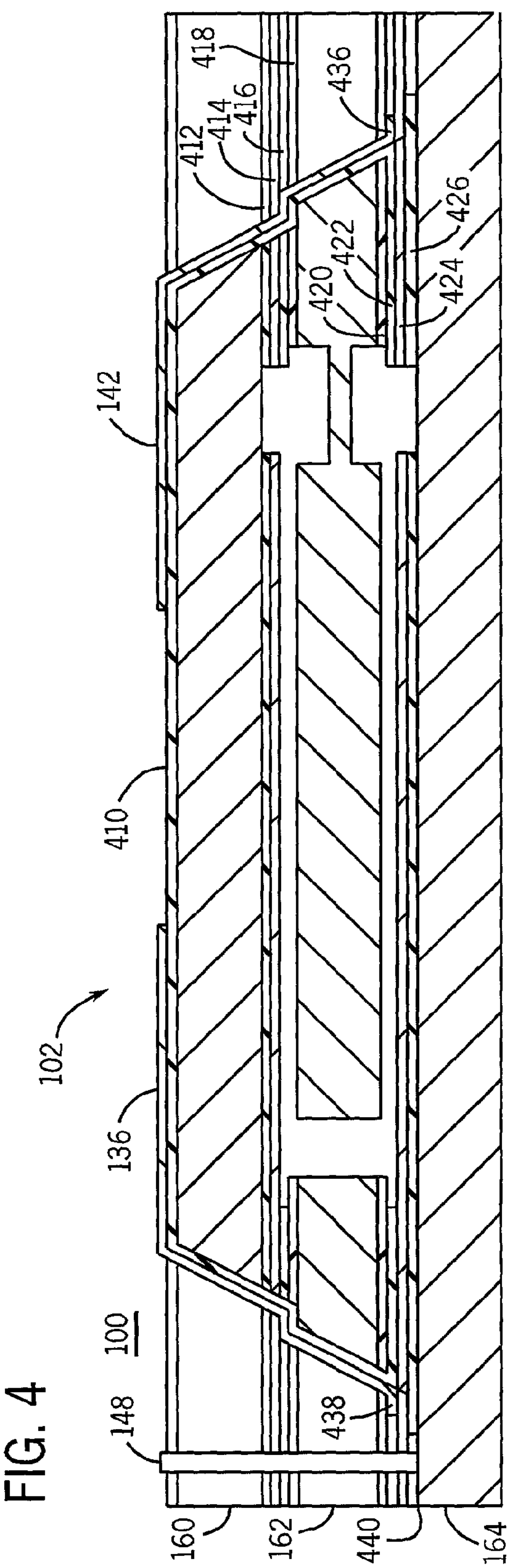
FIG. 5 is a sectional representation of the die directed along line 5—5 of FIG. 1.

Referring to FIGS. 4 and 5, the one or more layers 160, 162, and 164 in one example comprise, semiconductors, insulators, conductors, or the like.

Referring to FIG. 6 (a cross section 6—6 of FIG. 1 ), in one example, the compliant component 116 is located in an etched well 610 on the cover 160 of the die 102. The well 610 is a large enough size and shape to allow for the flexing of the compliant component 116. In another example, the compliant component 116 is on an interfacing surface 180 of the cover 160 of the die 102.

Referring to FIGS. 1 and 7, the compliant component 114 in one example comprises a flexible arm 710. The flexible arm 710 is attached both to the die 102 and the electrical interface component 130. In one example, the die 102 is etched in a pattern such that the arm 710 and the electrical interface component 130 have the space to be able to flex in response to stress applied to the flexible arm 710. In another example, the compliant component 114 is a beam that is micro machined into the die 102.

In one example, referring to FIG. 7, the compliant component 114 comprises a flexible arm 710. In one example, the flexible arm 710 and the cover 160, or the like, are etched from a single homogeneous material. In another example, the flexible arm 710 is etched from a separate homogeneous material as the cover 160, then attached to the cover 160, or the like. In another example, the flexible arm 710 is etched from a heterogeneous material as the cover 160, then attached to the cover 160, or the like.

In one example, the flexible arm 710 is a straight linear structure. In another example, the flexible arm 710 has one or more unstressed bends, curves, or the like. In another example, the flexible arm 710 is a plurality of flexible arms.

Figure 9:
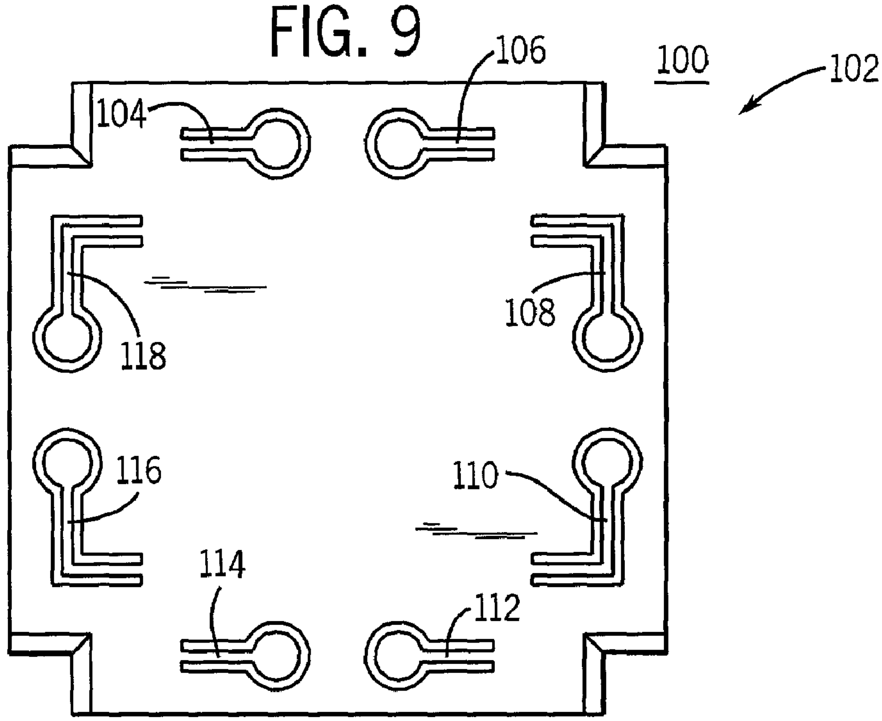
FIG. 9 is yet another example of the die of the apparatus of FIG. 1.

Referring to FIG. 9, in one example a subset of the compliant components 108, 110, 116, and 118 are designed to be compliant to translational movement in a single direction as well as being compliant with the direction of movement due to expansion. In on example, the translational movement in a single direction is horizontal on the die 102 plane. In another example, the translational movement in a single direction is vertical on the die 102 plane. The compliant component 104, 106, 108, 110, 112, 114, 116, and 118 orientation of FIG. 9 allows the overall connection of the die 102 to the separate layer 310 to be compliant to translational movement in a single direction as well as being compliant with the direction of movement due to expansion.

Figure 10:
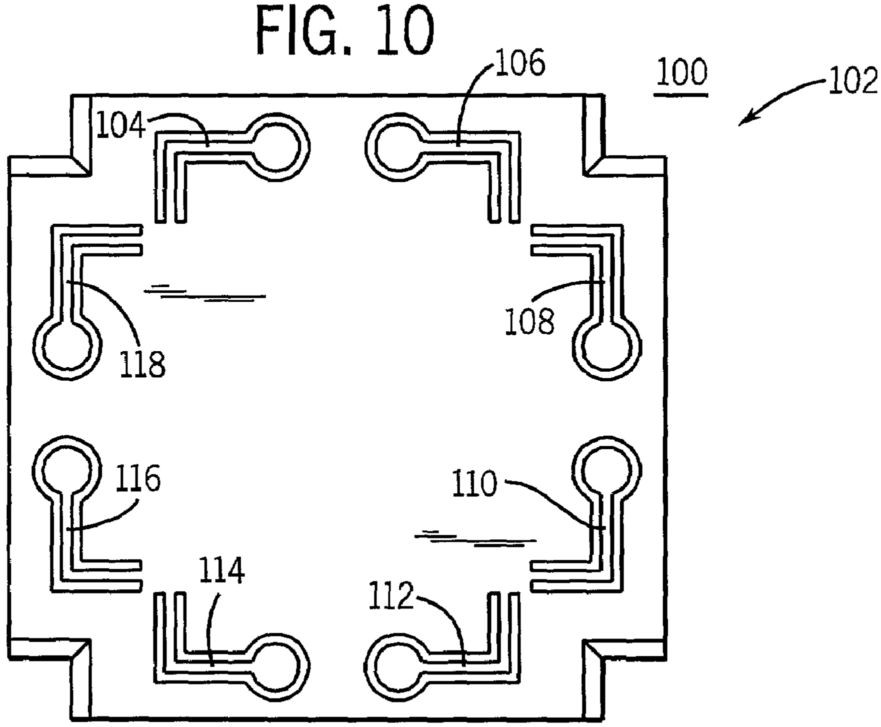
FIG. 10 is a further example of the die of the apparatus of FIG. 1.

Referring to FIG. 10, in one example a first subset of the compliant components 108, 110, 116, and 118 are designed to be compliant to translational movement in a first direction as well as being compliant with the direction of movement due to expansion. A second subset of the compliant components 104, 106, 112, and 114 are designed to be compliant to translational movement in a second direction as well as being compliant with the direction of movement due to expansion. In one example, the first direction is different from that of the second direction in the plane of the die 102. The compliant component 104, 106, 108, 110, 112, 114, 116, and 118 orientation of FIG. 10 allows the overall connection of the die 102 to the separate layer 310 to be compliant to translational movement in multiple directions, compliant to rotation, as well as being compliant with the direction of movement due to expansion. In one example, the translational movement is horizontal on the die 102 plane. In another example, the translational movement is vertical on the die 102 plane. In another example, the translational movement is vertical and horizontal on the die 102 plane. A die 102 connection compliant to translational, rotational, and expansion movements has a use in applications that are, in one example, counter balanced mechanical resonators. The resonators have one or more masses vibrating out of phase with each other. In one example, the masses need to vibrate at a same frequency. When used in such an application the compliant mounting structures 104, 106, 108, 110, 112, 114, 116, and 118 that allow translational, rotational, and expansion movements will couple the two masses together so they vibrate at the same frequency.

The electrical interface component 130, in one example is a conductive pad, or the like. In another example, the electrical interface component 130 is a solder ball, or the like. In another example, the electrical interface component 130 is a solder ball, or the like, connected to a conductive pad, or the like. The electrical interface component 130 is electrically insulated from the die 102.

In one example, the connection path 144 is a signal routing trace. The connection path 144 is used to pass the electrical signal from one of the one or more layers 160, 162, and 164 to the electrical interface component 130 on the interfacing surface 180.

In one example, a connection between the die 102 and the separated layer 310 can be accomplished by using one or more of flip chip technology, ball grid array technology, and pad grid array technology. Ball grid arrays are external connections that are arranged as an array of conducting pads on the interfacing surface 180 of the die 102. For explanatory purposes, the figures represent one example of the apparatus 100 that employs exemplary ball grid array technology. An electrical connection between a layer contact 190, 430, 432, 434, 436, 438, and 440 and the electrical interface component 120, 122, 124, 126, 130, 132, and 134 is made through the connection path 136, 138, 140, 142, 144, 146, and 148. In one example, one or more of the electrical interface components 128 are not used to electrically interface the die 102 to the separate layer 310. In one example, the electrical interface component 128 is extra for the specific example of the die 102. In another example, the electrical interface component 128 is intended to accommodate a possible future increase in the number of layer contacts 190, 430, 432, 434, 436, 438, and 440 in the die 102.

Referring to FIGS. 1, 3, 4 and 5, in one example each of the layers 160, 162, and 164, of a die 102, requiring an electrical connection to the separate layer 310 brings its connection to the interface surface 180 for interface with the separate layer 310. In one example, to access the various layers 160, 162, and 164 of the die 102, one or more notches 150, 152, 154, and 156 are created in the die 102.

In one example, the notch 156 could be a hole, cutout, path, window, opening and/or the like. The notch 156 can be at any location on the die 102. The notch 156 can be designed to reach any or all levels and/or depths. One or more layer contacts 430, 432, 434, 436, 438, and 440 can be reached through the same notch 156. Each of the notches 150, 152, 154, and 156 can be a different size, shape, or depth than any other of the notches 150, 152, 154, and 156.

Figure 11:
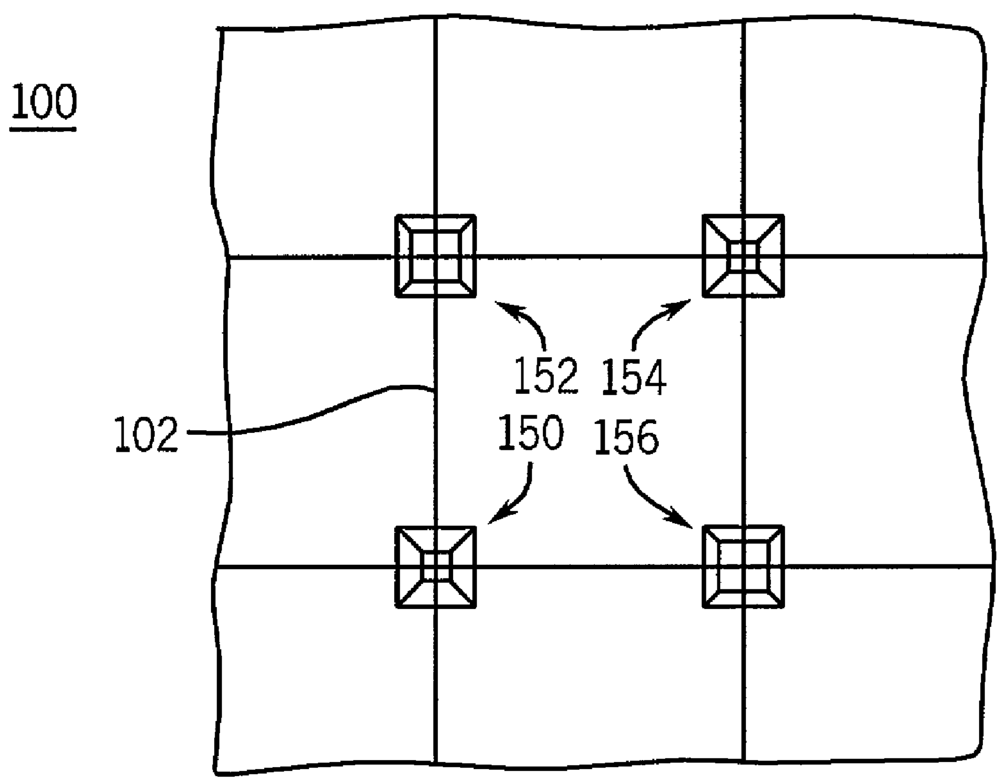
FIG. 11 is one example of a wafer fabrication pattern of the die of the apparatus of FIG. 1.

Referring to FIG. 11, the notch 156 is etched at the wafer level in order to take advantage of batch processing. In one example, the notches 150, 152, 154, and 156 are etched on the wafer to be a consistent size and depth. In one example, the notches 150, 152, 154, and 156 are etched on the wafer to be different sizes and depths. In one example, the etch could be an anisotropic wet etch. In another example, the etch could be a dry reactive ion etch, or the like.

Referring to FIGS. 1–5, the layer contact 434 connection is brought to the interfacing surface 180 by using a connection path 144. The connection path 144 uses the notch 156 to reach the respective die 102 layer contact 434. An insulator 410 is used to separate the connection path 144 from layer 160 and the other layer contacts 190, 430, 432, 436, 438, and 440. In one example, the insulator 410 is a silicon dioxide dielectric insulation layer.

In one example, the die 102 has one or more layer contacts 430, 432, 434, 436, 438, and 440 that are located on a different layer 162 and 164 than the layer 160 being used for interfacing to the separate layer 310. Each layer 160, 162, and 164 may have more than one layer contact 190, 430, 432, 434, 436, 438, and 440. An insulator 412, 416, 418, 420, 422, and 426 is used to separate each layer 160, 162, and 164 from the layer contacts 190, 430, 432, 434, 436, 438, and 440 of the other layers 160, 162, and 164, and the other layers 160, 162, and 164 themselves. In one example, the insulator 412, 416, 418, 420, 422, and 426 is a silicon dioxide dielectric insulation layer.

In one example, the die 102 and the separate layer 310 may not be the same material, and therefore may not have the same expansion coefficients. When the die 102 and the separate layer 310 are connected together and thermal changes, or any other expansion/contraction force, occur the die 102 will expand/contract by one amount and the separate layer 310 expands/contracts by another amount, different from that of the amount of the die 102. When the amount of expansion/contraction is different in the die 102 than in the separate layer 310, there will be a stress applied at the connection of the die 102 and the separate layer 310. This stress is relieved at the connection between the die 102 and the separate layer 310 by the flexing of the compliant component 114.

In one example, as shown in FIGS. 1, 7, and 8, the stress applied to the connection is likely to be in a radial direction from/to the midpoint 158 of the die 102 to/from the electrical interface component 130. In one example, the flexible arm 710 attached to the electrical interface component 130, is oriented perpendicular to the radial axis. When the stress is likely to be in a radial direction this perpendicular flexible arm 710 orientation provides a unstressed starting point for the electrical interface component 130. This unstressed starting point provides a wide range of motion in either radial direction. In another example, as shown in FIG. 8, the flexible arm 710 attached to the electrical interface component 130, is oriented parallel to one or more of the die 102 edges.

Referring to FIGS. 4 and 5, in one example, the die 102 is a sensor system. The die 102 has three element layers, a top cover 160, bottom cover 164, and a sensing center element 162. Each element layer 160, 162, and 164 has corresponding of the insulators 412, 418, 420, and 426 added to each surface that will be bonded to another surface. A conducting material 414 and 424 is laid down on the corresponding of the insulators 412 and 426 of each of the top cover 160 and the bottom cover 164 on the surface that is adjacent to the center element 162. The insulators 416 and 422 are laid down over the conducting materials 414 and 424. The three element layers 160, 162, and 164 are bonded together.

In one example, a plurality of layer contacts 430, 432, 434, 436, 438, and 440 are buried between the layers 160, 162, and 164 of the die 102. The layer contacts 430, 432, 434, 436, 438, and 440 are required to be on the interfacing surface 180 for the die 102 to be mounted directly to the separate layer 310, such as a substrate or circuit board. The interfacing surface 180 has a plurality of electrical interfacing components 120, 122, 124, 126, 128, 130, 132, and 134. Notches 150, 152, 154, and 156 are made through the die 102 to expose the buried layer contacts 430, 432, 434, 436, 438, and 440. Along the walls of the notch 156 the insulator 410 is applied to separate the connection path 144 from the element layers 160, 162, and 164 and the other layer contacts 430, 432, 436, 438, and 440. The desired layer contact 434 will not be covered by the insulator 410 to allow connection between the layer contact 434 and the connection path 144. The connection path 144 is used to pass the electrical signal from the layer contact 434 to the electrical interface component 130 on the interfacing surface 180. In one example, the connection path 144 is a signal routing trace. The electrical interface component 130 on the interfacing surface 180 is attached to compliant component 114. The compliant component 114 allows the die 102 to directly connect to the separate layer 310 with the same expansion properties or the separate layer 310 with different expansion properties.

Turning to FIGS. 12–15, in another example, an apparatus 100 comprises one or more dice 102, one or more electrical components 1220, and one or more separate layers 310. The die 102, in one example, further comprises one or more connection paths 1204 and 1206 and one or more electrical interface components 1208 and 1210. The electrical component 1220, in one example, comprises one or more of processing electronics, central processing units ("CPUs"), integrated circuits and application specific integrated circuits ("ASICs"). The electrical component 1220 in one example comprises one or more electrical interface components 1222 and 1224.

In one example, the connection paths 1204 and 1206 are signal routing traces. In one example, the connection paths 1204 and 1206 comprise a conducting material. The connection path 1204 is used to pass the electrical signal from one of the one or more layers 160, 162, and 164, exposed by notch 156, to the electrical interface component 1208.

The one or more electrical interface components 1208 and 1210 in one example comprise one or more of electrical contacts, conductive pads, and solder balls. The one or more electrical interface components 1208 and 1210 are electrically insulated from the die 102.

Figure 12:
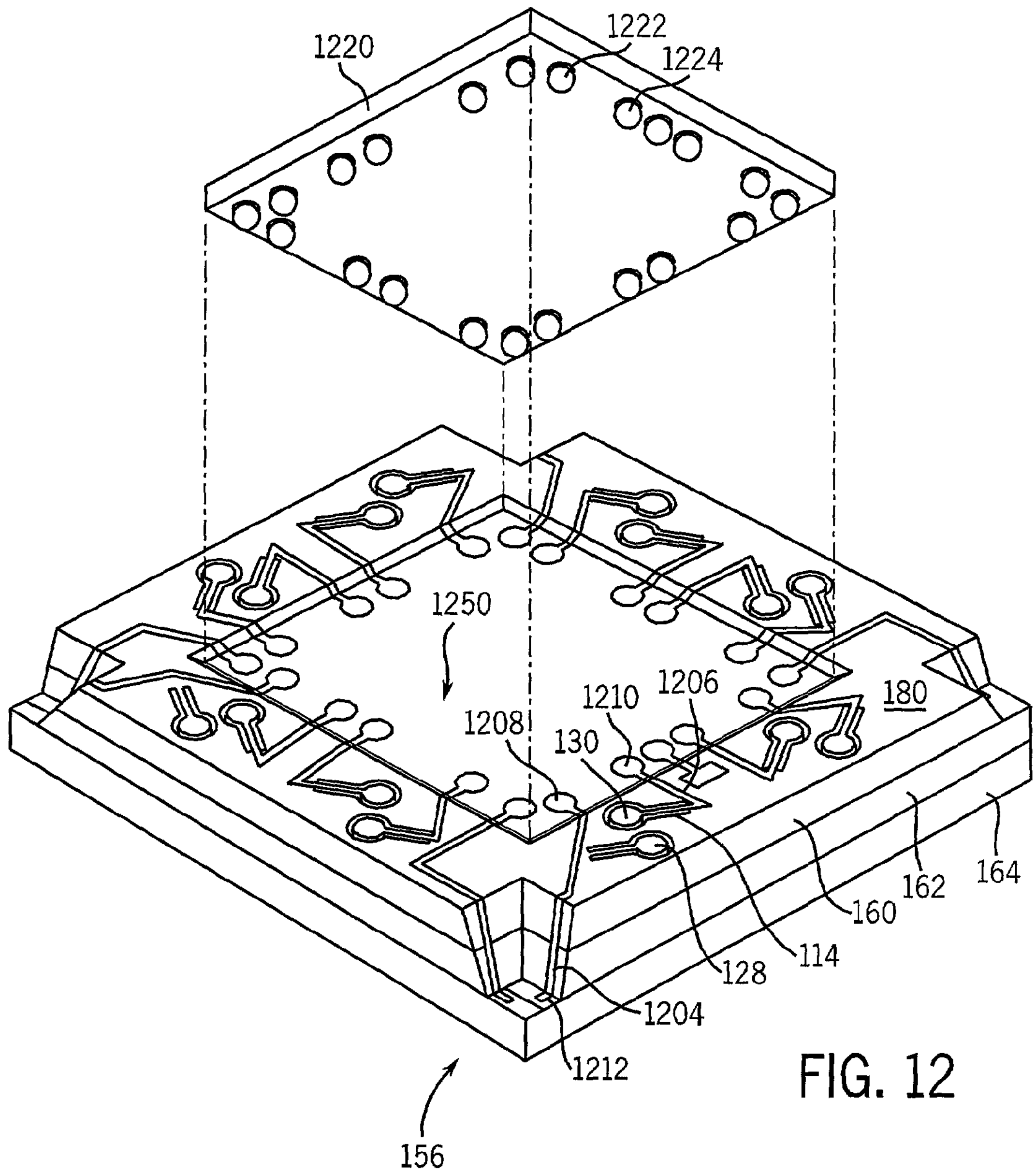
FIG. 12 is a representation of the die of the apparatus of FIG. 1 and an electrical component receivable in a recess of the die.

Referring to FIG. 12, in one example, the electrical component 1220 and the die 102 are made from a same material, and therefore are not likely to experience differences in expansion. In one example, the connection between the electrical component 1220 and the die 102 can be accomplished by using one or more of flip chip technology, ball grid array technology, and pad grid array technology. In one example, the connection between the electrical component 1220 and the die 102 is made through one or more solder balls. The one or more solder balls electrically and mechanically connect the electrical component 1220 to the die 102. The one or more solder balls comprise a conductive material to electrically connect the electrical component 1220 to the die 102. The one or more solder balls comprise a bonding material to mechanically connect the electrical component 1220 to the die 102.

In another example, the electrical component 1220 and the die 102 are made from different materials, and therefore are likely to experience differences in expansion. In one example, the expansion is due to one or more of thermal changes, material aging, difference in stability, and moisture swelling. In addition to one or more of flip chip technology, ball grid array technology, and pad grid array technology, the connection between the electrical component 1220 and the die 102, would benefit from using a compliant mounting component to support the electrical interface components 1208 and 1210. The compliant mounting component in one example comprises a structure similar to compliant component 114. The connection between the electrical component 1220 and the die 102 using a compliant component similar to the compliant component 114 is forgiving to differences in relative movement between the electrical component 1220 and the die 102.

Referring to FIG. 12, an electrical connection is made through the connection path 1204. The electrical connection is used to route the electrical signal between a layer contact 1212 and the electrical interface component 1208. The electrical interface component 1208 transfers the electrical signal to electrical interface component 1222 of the electrical component 1220. In one example, the electrical interface component 1222 comprises an input to the electrical component 1220. In one example, the electrical component 1220 processes one or more electrical signals from the die 102. In one example, the processed electrical signal results are placed on electrical interface component 1224 of the electrical component 1220. In one example, the electrical interface component 1224 comprises an output of the electrical component 1220. The processed electrical signal results are transferred to the electrical interface component 1210 on the die 102. The processed electrical signal results are transferred to the electrical interface component 130 through the connection path 1206. The electrical interface component 130 is mounted to the flexible support, compliant component 114. In one example, electrical interface component 130 comprises a connection component for connection with the separate layer 310.

Figure 15:
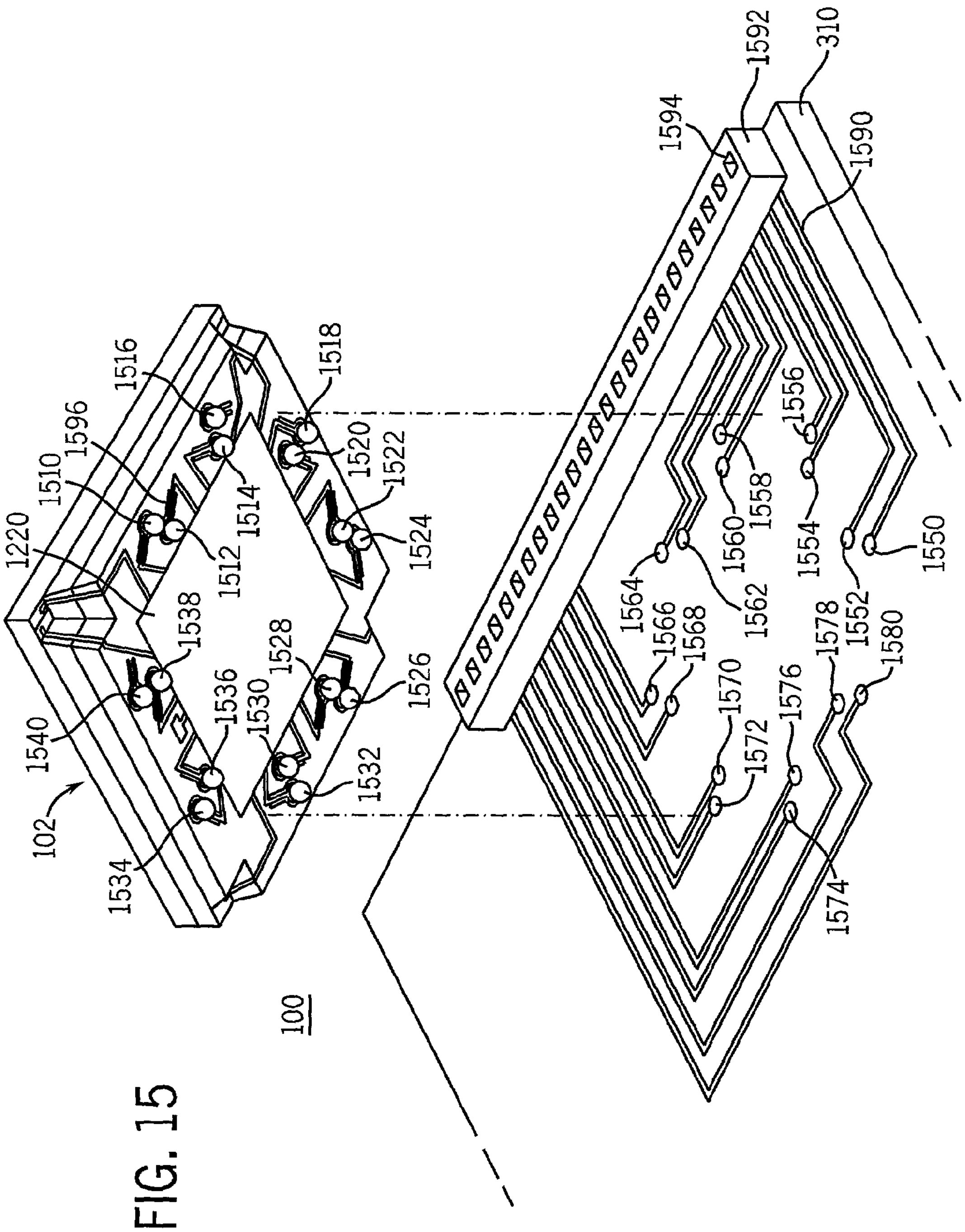
FIG. 15 is a representation of one example of connection among the die, an electrical component, and a separate layer of the apparatus of FIG. 1.

Referring to FIG. 15 in one example the die 102 and electrical component 1220 mount to a separate layer 310. The die 102 comprises one or more electrical interface components 1510, 1512, 1514, 1516, 1518, 1520, 1522, 1524, 1526, 1528, 1530, 1532, 1534, 1536, 1538, and 1540 to make connection to the respective electrical interface components 1550, 1552, 1554, 1556, 1558, 1560, 1562, 1564, 1566, 1568, 1570, 1572, 1574, 1576, 1578, and 1580 of the separate layer 310. In one example, the electrical interface component 1550 comprises an input of the electrical component 1220. In another example, the electrical interface component 1550 comprises an output of the electrical component 1220. In one example, the electrical interface component 1550 is connected to an electrical interface component 1592 through a connection path 1590. The electrical interface component 1592 comprises one or more connections slots 1594 to electrically and physically attach to a separate component. The connection path 1590 in one example comprises a conducting path.

Referring to FIG. 12-15, in one example, the electrical component 1220 is a separate chip. To integrate the electrical component 1220 to the die 102, an electrical and mechanical connection is made between the electrical interface components 1208 of the die 102 and the electrical interface components 1222 of the electrical component 1220. In one example, the electrical component 1220 electrically connects at the interfacing surface 180. In another example, the electrical component 1220 electrically connects in a recess 1250 of the die 102. The recess 1250 is designed so that the electrical component 1220 can rest in the recess 1250. The depth of the recess 1250 is designed so that when the die 102 and the electrical component 1220 are connected to the separate layer 310 the electrical component 1220 is not obstructing the electrical interface component 1510 of the die 102 from making contact with the electrical interface component 1550 of the separate layer 310.

Figure 14:
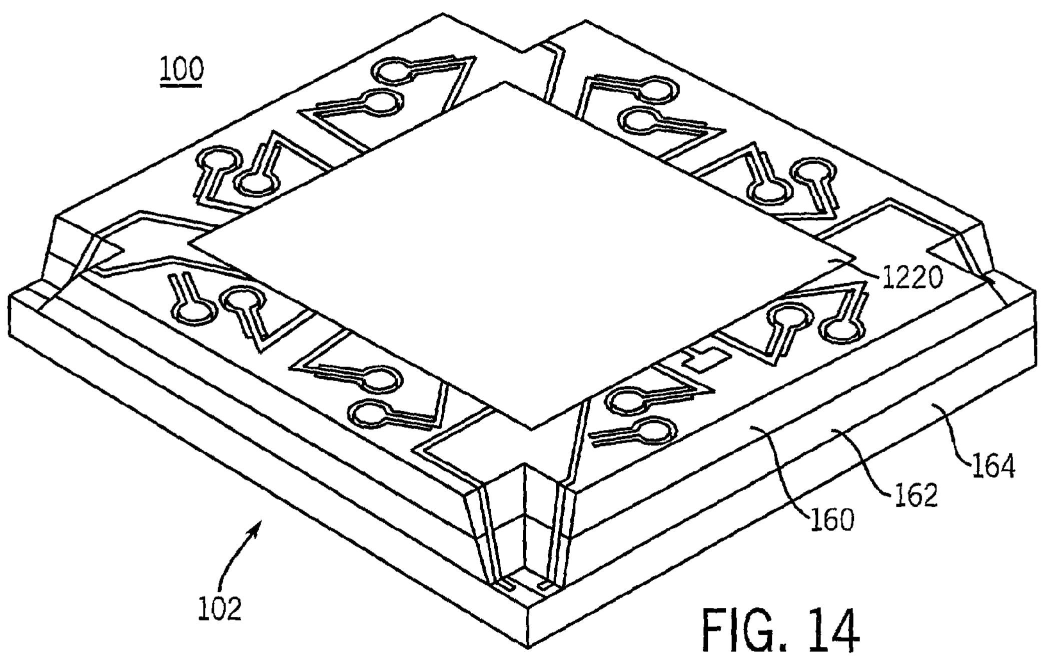
FIG. 14 is a representation of the die of the apparatus of FIG. 1 and an electrical component connected with the die.

Referring to FIG. 14, in one example, the electrical components 1220 are completely integrated into the die 102 by designing the die 102 to include the electrical components 1220. The one or more of the electrical signals generated by the die 102 are fed directly to the integrated electrical components 1220.

Referring to FIG. 12-15, having the electrical component 1220 within the periphery the die 102 creates a higher level of integration. Rather than having the electrical component 1220 and the die 102 use separate footprints, integrating them uses a single footprint on the separate layer 310. Thus, saving space on the separate layer 310.

Having the electrical component 1220 integrated into the die 102 allows for testing of the electrical component 1220 and the die 102 together without complete installation to the separate layer 310.

Figure 16:
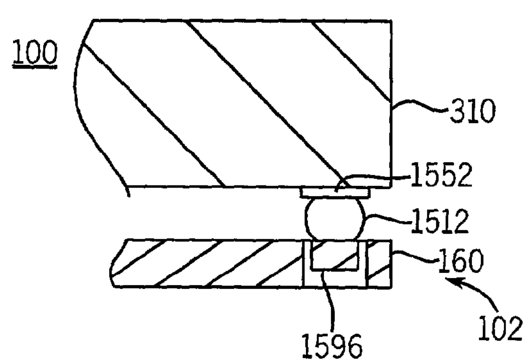
FIG. 16 is a representation of one example of connection among the die and a separate layer of the apparatus of FIG. 1.
Figure 13:
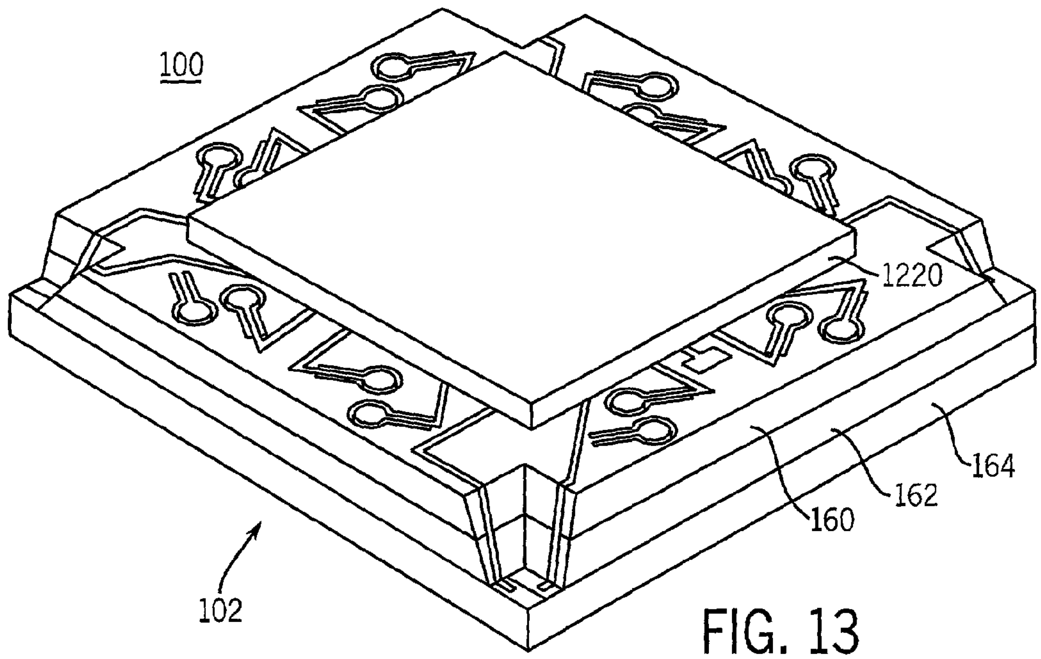
FIG. 13 is a representation of the die of the apparatus of FIG. 1 and an electrical component connected with the die.

Turning to FIG. 16, in one example, the attachment of the die 102 to the separate layer 310 is made with one or more of electrical interface components 1512. Electrical interface component 1512 of the separate layer 310 is connected to the die 102 through the electrical interface component 1552. In one example, the connection between the die 102 and the separate layer 310 is made through one or more solder balls. In one example, the solder ball is heated, centered, and cooled to complete the connection between the die 102 and the separate layer 310. In one example, the solder ball is pressed together during the connection process, thus the solder ball is deformed from a spherical shape. The one or more solder balls electrically and mechanically connect the die 102 to the separate layer 310. The one or more solder balls comprise a conductive material to electrically connect the die 102 to the separate layer 310. The one or more solder balls comprise a bonding material to mechanically connect the die 102 to the separate layer 310.

One or more features described herein with respect to one or more of the compliant components 104, 106, 108, 110, 112, 114, 116, 118 in one example apply analogously to one or more other of the compliant components 104, 106, 108, 110, 112, 114, 116, 118. One or more features described herein with respect to one or more of the electrical interface components 120, 122, 124, 126, 128, 130, 132, 134 in one example apply analogously to one or more other of the electrical interface components 120, 122, 124, 126, 128, 130, 132, 134. One or more features described herein with respect to one or more of the connection paths 136, 138, 140, 142, 144, 146, 148 in one example apply analogously to one or more other of the connection paths 136, 138, 140, 142, 144, 146, 148. One or more features described herein with respect to one or more of the notches 150, 152, 154, 156 in one example apply analogously to one or more other of the notches 150, 152, 154, 156. One or more features described herein with respect to one or more of the electrical interface components 130, 1510, 1512, 1514, 1516, 1518, 1520, 1522, 1524, 1526, 1528, 1530, 1532, 1534, 1536, 1538, and 1540 in one example apply analogously to one or more other of the electrical interface components 130, 1510, 1512, 1514,

1516, 1518, 1520, 1522, 1524, 1526, 1528, 1530, 1532, 1534, 1536, 1538, and 1540. One or more features described herein with respect to one or more of the electrical interface components 1550, 1552, 1554, 1556, 1558, 1560, 1562, 1564, 1566, 1568, 1570, 1572, 1574, 1576, 1578, and 1580 in one example apply analogously to one or more other of the electrical interface components 1550, 1552, 1554, 1556, 1558, 1560, 1562, 1564, 1566, 1568, 1570, 1572, 1574, 1576, 1578, and 1580.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:

a die with at least first and second portions, the first portion of the die mechanically and electrically connectable with a circuit board; and an integrated circuit component mechanically and electrically connected with the second portion of the die;

wherein upon operation the die serves to generate one or more electrical signals that are passed to the integrated circuit component;

wherein the first portion of the die comprises a compliant cantilever component for supporting an electrical interface component that serves to electrically and mechanically couple the die with the circuit board.

2. The apparatus of claim 1, wherein the one or more electrical signals comprise one or more first electrical signals;

wherein upon operation the integrated circuit component serves to generate one or more second electrical signals, based upon the one or more first electrical signals, that are passed to the die for output to the circuit board.

3. The apparatus of claim 2, wherein one of the one or more second electrical signals is passed to the electrical interface component.

4. The apparatus of claim 1, wherein the compliant cantilever component, upon relative movement between the die and the circuit board, serves to promote a decrease in stress in one or more of the die and the circuit board.

5. The apparatus of claim 1, wherein the die comprises a center, wherein the die comprises a radius between the center of the die and the electrical interface component;

wherein a portion of the compliant cantilever component is substantially perpendicular to the radius of the die.

6. The apparatus of claim 5, wherein upon relative expansion between the die and the circuit board along the radius the cantilever component accommodates the relative expansion, wherein the cantilever component deforms to decrease the stress in one or more of the die and the circuit board.

7. The apparatus of claim 1, wherein the electrical interface component comprises a first electrical interface component, wherein the circuit board comprises one or more second electrical interface components, wherein the die is mechanically and electrically connectable to the circuit board through the one or more second electrical interface components;

wherein the integrated circuit component communicates with the circuit board through the one or more second electrical interface components.

8. The apparatus of claim 1, wherein the integrated circuit component is attached to an outer surface of the die.

9. The apparatus of claim 1, wherein the integrated circuit component is attached to the die in a recess in an outer surface of the die.

10. The apparatus of claim 1, wherein the second portion of the die comprises an interface surface, wherein the integrated circuit component comprises an outer surface, wherein the interface surface and the outer surface are in a substantially same plane.

11. The apparatus of claim 1, wherein the electrical interface component comprises a first electrical interface component, wherein the second portion of the die comprises an interface surface, wherein the interface surface comprises a second electrical interface component;

wherein an electrical contact is located on a second surface, wherein a connection path electrically couples the second electrical interface component to the electrical contact.

12. The apparatus of claim 1, wherein the second portion comprises an interface surface of the die, wherein the interface surface comprises one or more fist and second electrical interface components;

wherein the one or more first electrical interface components provide input to the integrated circuit component, wherein the one or more second electrical interface components receive output from the integrated circuit component.

13. The apparatus of claim 12, wherein the interface surface comprises a first interface surface, wherein the first portion comprises a second interface surface of the die, wherein the second interface surface comprises one or more electrical interface components;

wherein one or more connection paths electrically couple the one or more electrical interface components of the second interface surface to the respective one or more second electrical interface components of the first interface surface.

14. The apparatus of claim 1, wherein the die comprises a micro electro mechanical system.

15. The apparatus of claim 1, wherein the die comprises one or more of sensors and actuators.

16. The apparatus of claim 1, wherein the die comprises an accelerometer.

17. An apparatus, comprising:

a die with first and second interfaces, wherein an integrated circuit component is mounted to the die, wherein the die is electrically and mechanically connected to a circuit board through an electrical interface component supported by a compliant cantilever component;

wherein the integrated circuit component employs the first interface to transfer one or more electrical signals to the die;

wherein the die employs the second interface to transfer one or more second electrical signals to the circuit board.

18. The apparatus of claim 17, wherein the die employs the first interface to transfer one or more third electrical signals to the integrated circuit component.

19. The apparatus of claim 17, wherein one or more of the one or more second electrical signals are the same as one or more of the one or more first electrical signals.

20. The apparatus of claim 1, wherein the first portion of the die comprises a recess, wherein the compliant cantilever component is located in the recess;

wherein the recess provides space for movement of the compliant cantilever component to accommodate a relative movement between the die and the circuit board.

21. The apparatus of claim 1, wherein the compliant cantilever component is mechanically connected with the electrical interface component, wherein the electrical interface component is mechanically connected with the circuit board.

22. The apparatus of claim 21, wherein the electrical interface component comprises a solder ball that is connected with the compliant cantilever component and the circuit board.

23. The apparatus of claim 1, wherein upon relative movement between the die and the circuit board, the compliant cantilever component bends in a plane of a face of the die to accommodate the relative movement.

24. The apparatus of claim 1, wherein upon connection of the die and circuit board, a major face of the circuit board is substantially parallel with a major face of the die;

wherein the compliant cantilever component lies in a plane of the major face of the die;

wherein upon relative expansion between the die and the circuit board, the compliant cantilever component bends in an in-plane direction to accommodate the relative expansion.

25. The apparatus of claim 1, wherein the die comprises a radius between a center point on a face of the die and the electrical interface component;

wherein the compliant cantilever component comprises a length and a width, wherein the compliant cantilever component is supported at one end portion of the length;

wherein the length of the compliant cantilever component is aligned substantially perpendicular to the radius of the compliant cantilever component.

26. The apparatus of claim 25, wherein the compliant cantilever component bends in a direction substantially parallel to the radius to accommodate relative movement between the die and the circuit board.

* * * * *